(12) United States Patent
Tan et al.

(10) Patent No.: US 9,508,625 B2
(45) Date of Patent: Nov. 29, 2016

(54) SEMICONDUCTOR DIE PACKAGE WITH MULTIPLE MOUNTING CONFIGURATIONS

(71) Applicant: Infineon Technologies AG, Neubiberg (DE)

(72) Inventors: Tian San Tan, Melaka (MY); Theng Chao Long, Melaka (MY)

(73) Assignee: Infineon Technologies AG, Neubiberg (DE)

(*) Notice: Subject to any disclaimer, the term of this patent is extended or adjusted under 35 U.S.C. 154(b) by 77 days.

(21) Appl. No.: 14/242,114

(22) Filed: Apr. 1, 2014

(65) Prior Publication Data
US 2015/0279757 A1  Oct. 1, 2015

(51) Int. Cl.
| | |
|---|---|
| *H01L 23/31* | (2006.01) |
| *H01L 23/498* | (2006.01) |
| *H01L 23/492* | (2006.01) |
| *H01L 23/495* | (2006.01) |
| *H01L 23/00* | (2006.01) |

(52) U.S. Cl.
CPC ......... *H01L 23/3157* (2013.01); *H01L 23/492* (2013.01); *H01L 23/49548* (2013.01); *H01L 23/49562* (2013.01); *H01L 23/49572* (2013.01); *H01L 23/49838* (2013.01); *H01L 24/09* (2013.01); *H01L 24/83* (2013.01); *H01L 23/564* (2013.01); *H01L 2224/0903* (2013.01); *H01L 2224/09181* (2013.01); *H01L 2924/181* (2013.01)

(58) Field of Classification Search
CPC ............. H01L 23/3157; H01L 23/492; H01L 23/49548; H01L 23/49562; H01L 23/49572; H01L 24/83; H01L 24/09; H01L 23/49838; H01L 2924/181; H01L 2224/0903; H01L 2224/09181; H01L 23/564
See application file for complete search history.

(56) References Cited

U.S. PATENT DOCUMENTS

| | | | |
|---|---|---|---|
| 7,893,545 B2 | 2/2011 | Otremba | |
| 2008/0054438 A1* | 3/2008 | Germain | H01L 23/4334 257/690 |
| 2011/0095410 A1* | 4/2011 | Gomez | H01L 21/6836 257/676 |

FOREIGN PATENT DOCUMENTS

DE      102008029644 A1    1/2009

* cited by examiner

*Primary Examiner* — John P Dulka
*Assistant Examiner* — Charles R Peters
(74) *Attorney, Agent, or Firm* — Murphy, Bilak & Homiller, PLLC

(57) ABSTRACT

A semiconductor die package includes first, second and third metal blocks insulated from one another. The first metal block has a thinner inner section, a first thicker outer section at a first end of the thinner inner section and a second thicker outer section at a second end of the thinner inner section opposing the first end. The second metal block has a thicker outer section and a thinner inner section protruding inward from the thicker outer section. The third metal block has a thicker outer section and a thinner inner section protruding inward from the thicker outer section. A semiconductor die has a first terminal attached to the thinner inner section of the first metal block, a second terminal attached to the thinner inner section of the second metal block, and a third terminal attached to the thinner inner section of the third metal block.

33 Claims, 22 Drawing Sheets

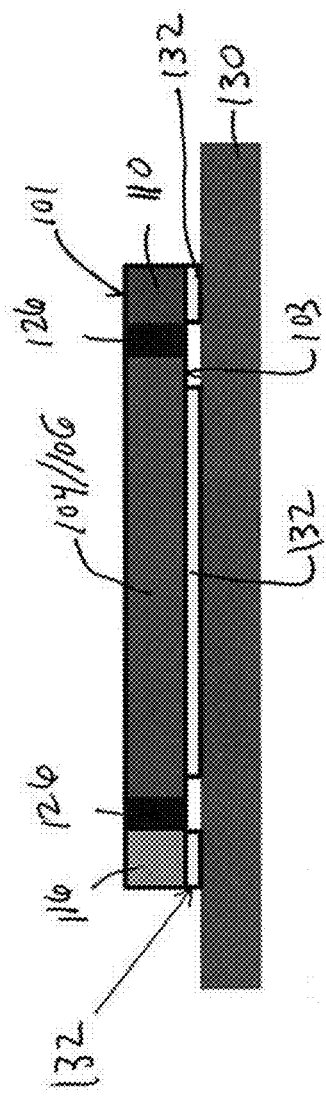
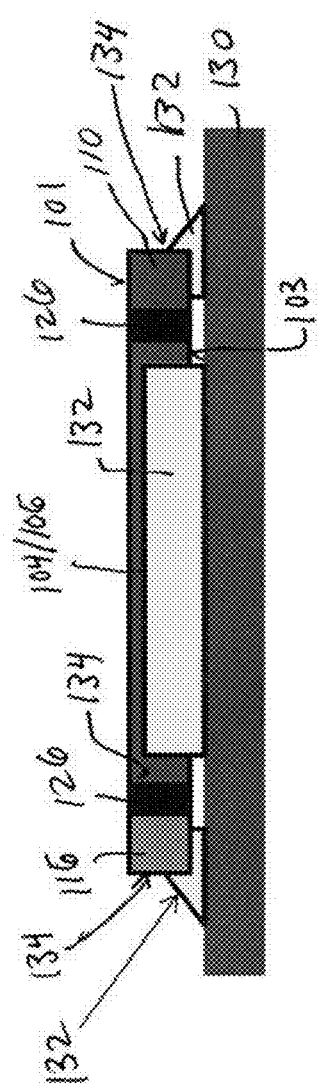
Figure 3
Figure 4

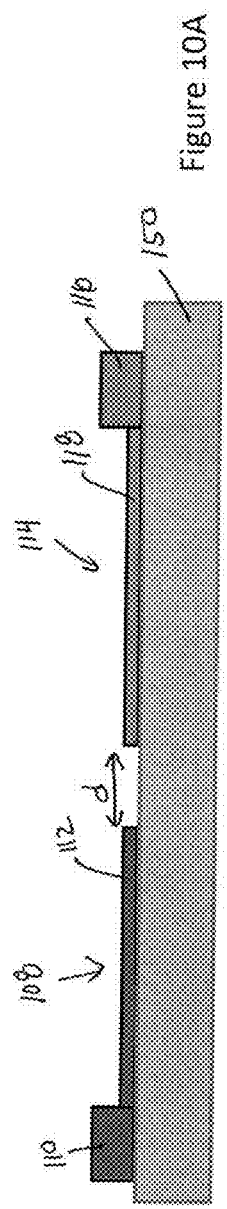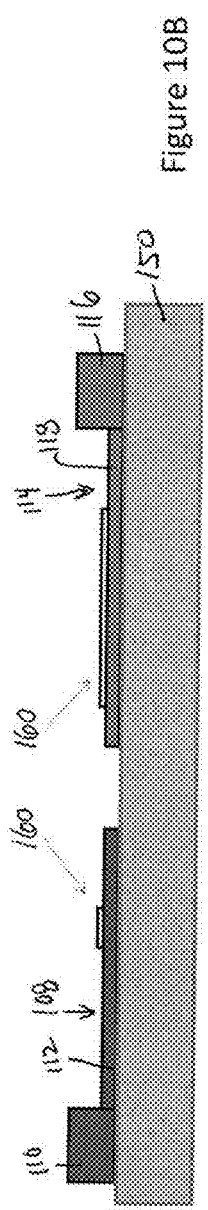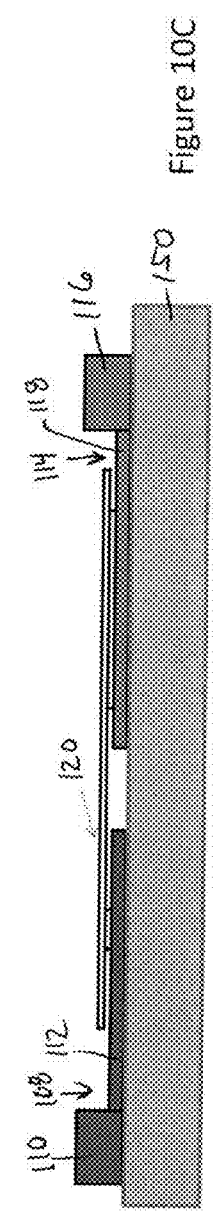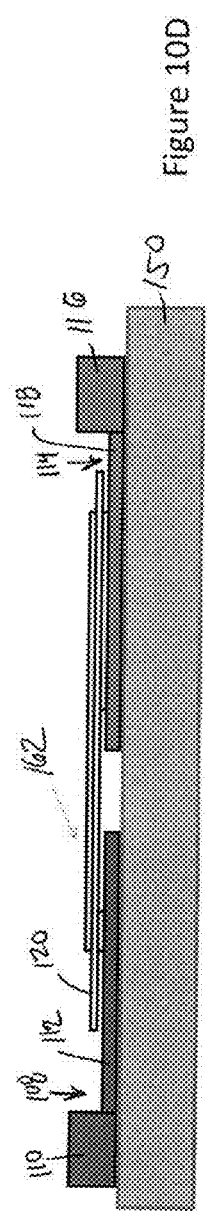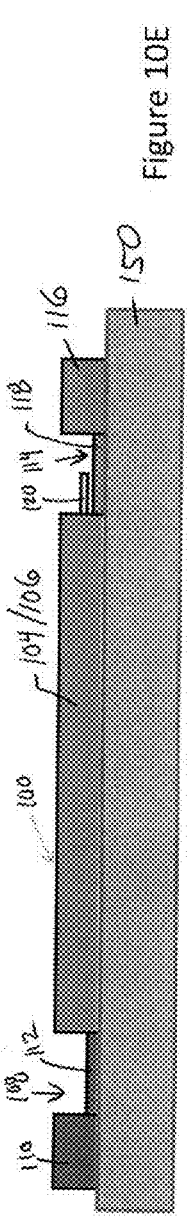

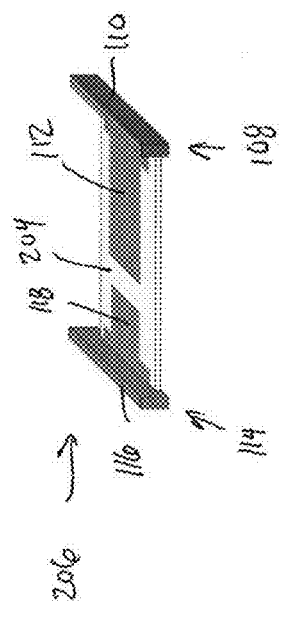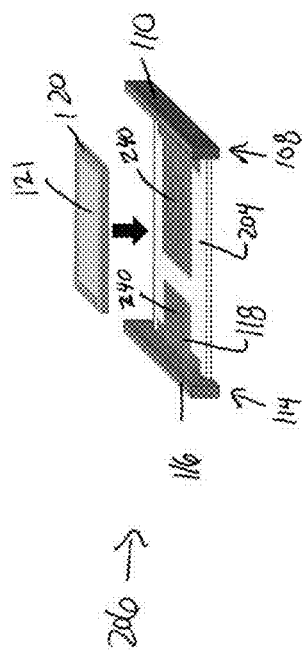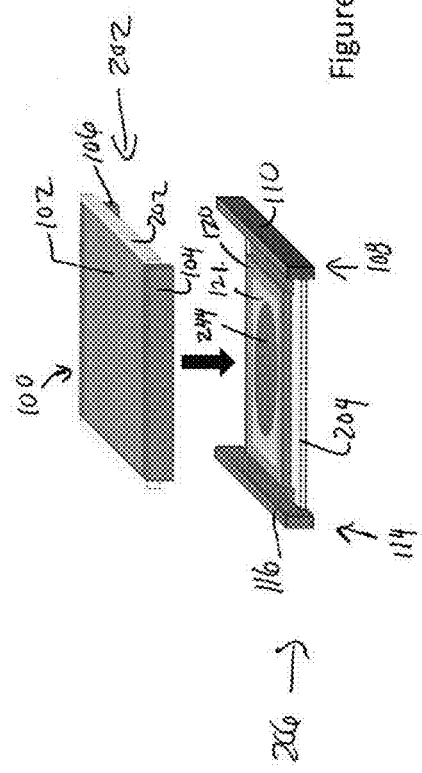

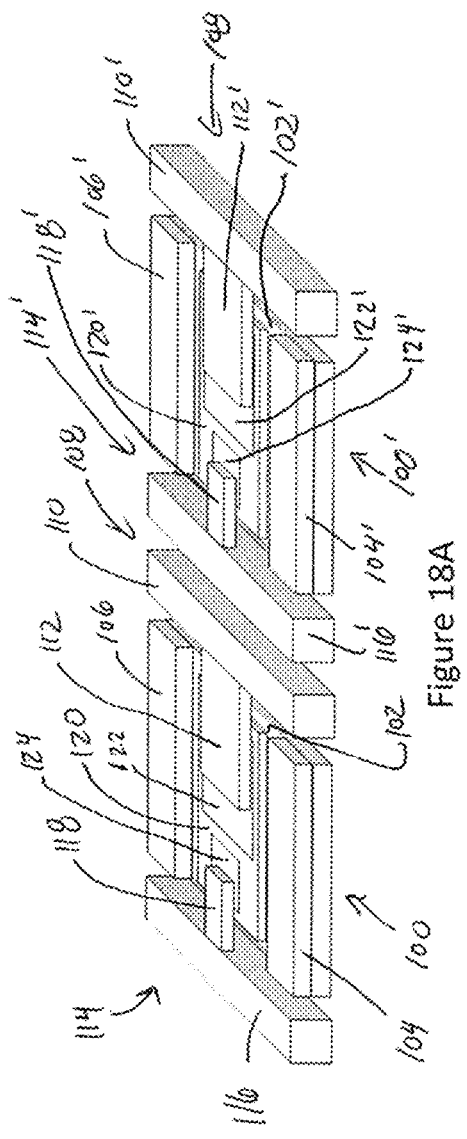
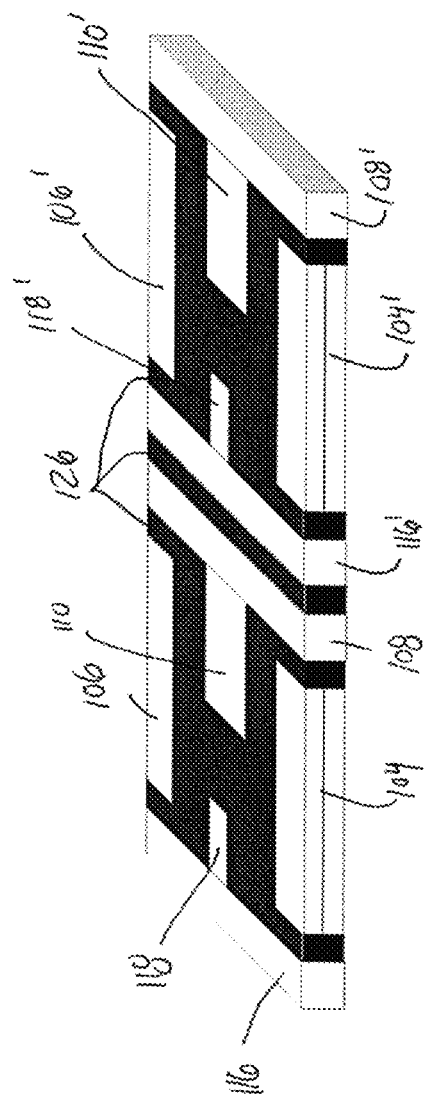
Figure 18A
Figure 18B

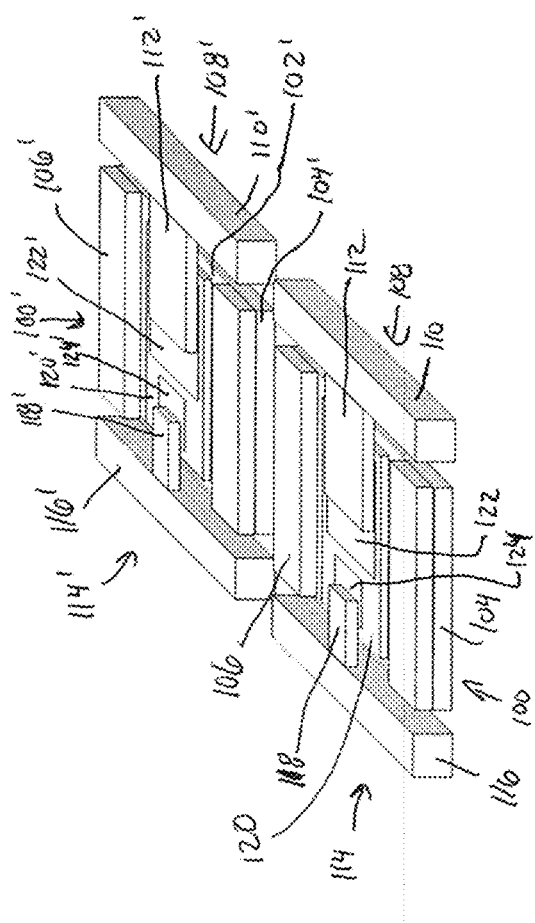
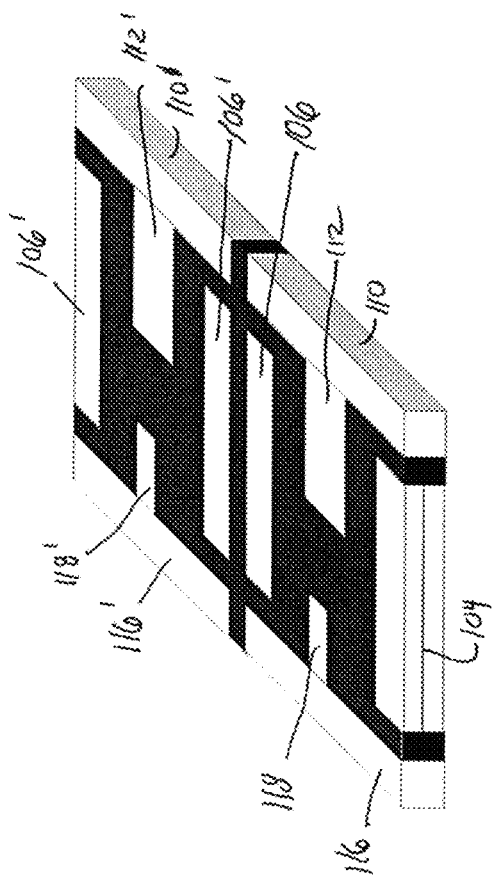

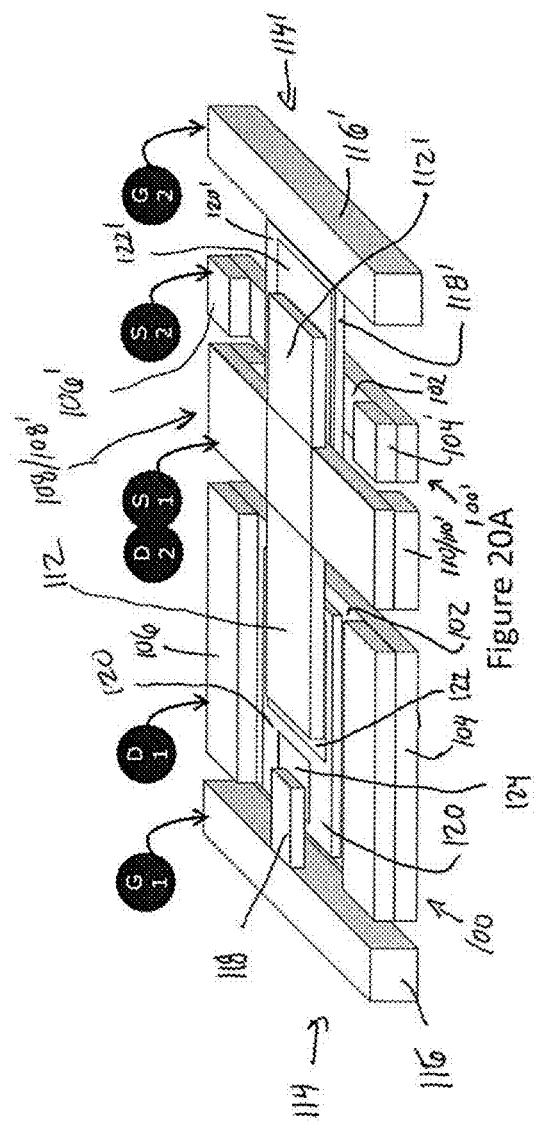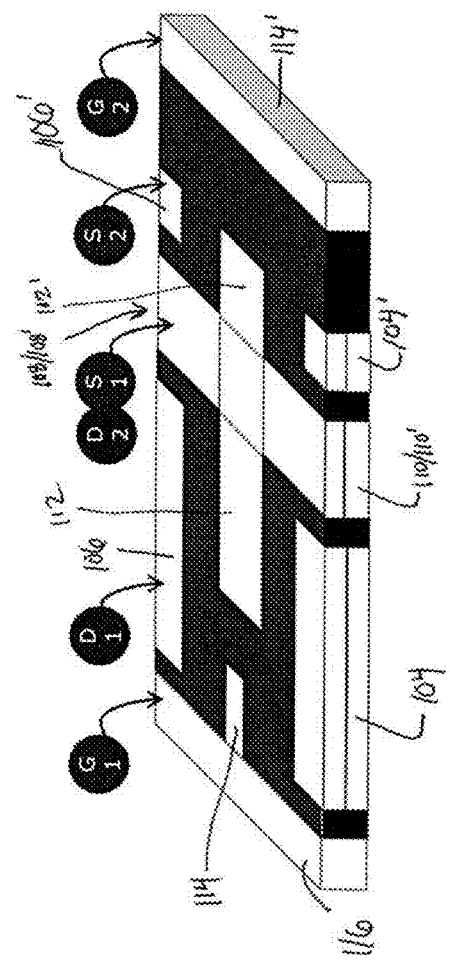

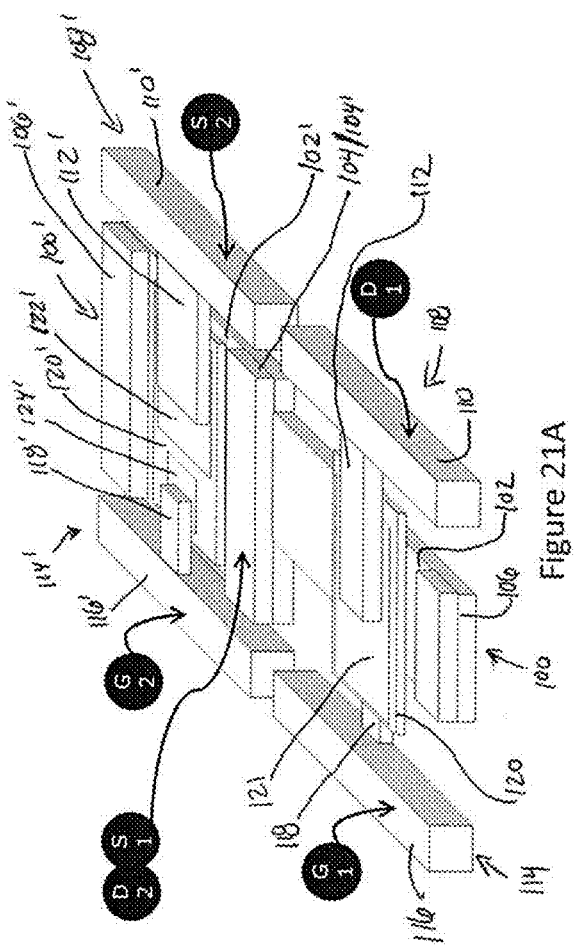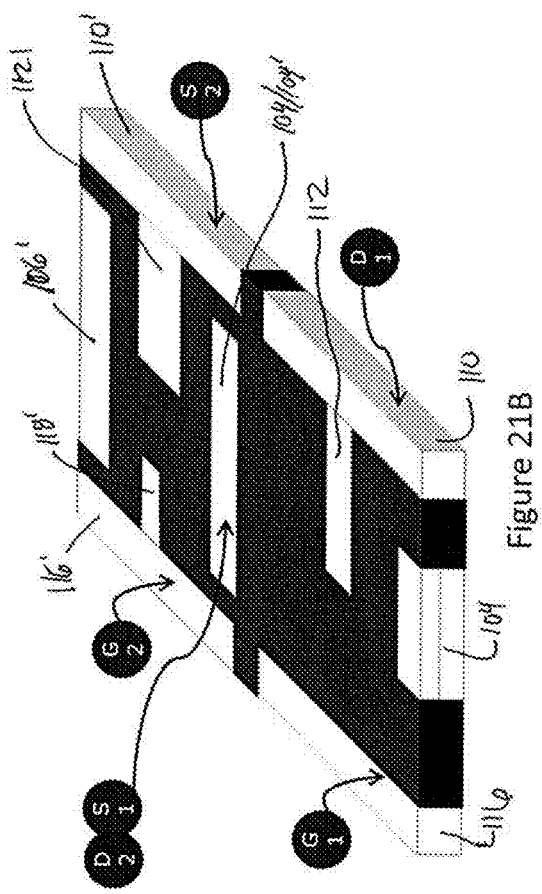

SEMICONDUCTOR DIE PACKAGE WITH MULTIPLE MOUNTING CONFIGURATIONS

TECHNICAL FIELD

The present application relates to semiconductor die packages, in particular mounting configurations for semiconductor die packages.

BACKGROUND

Conventional semiconductor packages are not designed for multiple uses or applications. For example, SMD (surface mount device) packages have gull-wing leads, J-leads or flat leads which are surface mounted to a board and are designed for low current and low voltage systems. TO (transistor outline) packages have leads which are inserted into through holes in a board and are designed for high current and high voltage systems. TO packages have longer leads than SMD packages, increasing parasitic inductance. Micro-voids can form in the joining material used to attach an SMD package to a board, resulting in poor heat dissipation. TO and SMD packages have different assembly processes. Both TO and SMD packages have dozens of package types for accommodating different applications and uses. A universal semiconductor die package is therefore desirable.

SUMMARY

According to an embodiment of a semiconductor die package, the package comprises a first metal block having a thinner inner section, a first thicker outer section at a first end of the thinner inner section and a second thicker outer section at a second end of the thinner inner section opposing the first end. The package further comprises a second metal block insulated from the first metal block and having a thicker outer section and a thinner inner section protruding inward from the thicker outer section, and a third metal block insulated from the first and second metal blocks and having a thicker outer section and a thinner inner section protruding inward from the thicker outer section. A semiconductor die has a first terminal attached to the thinner inner section of the first metal block, a second terminal attached to the thinner inner section of the second metal block, and a third terminal attached to the thinner inner section of the third metal block.

According to an embodiment of a semiconductor assembly, the assembly comprise a circuit board and a semiconductor die package attached to the circuit board. The semiconductor die package comprises a first metal block having a thinner inner section, a first thicker outer section at a first end of the thinner inner section and a second thicker outer section at a second end of the thinner inner section opposing the first end, a second metal block insulated from the first metal block and having a thicker outer section and a thinner inner section protruding inward from the thicker outer section, and a third metal block insulated from the first and second metal blocks and having a thicker outer section and a thinner inner section protruding inward from the thicker outer section. A semiconductor die has a first terminal attached to the thinner inner section of the first metal block, a second terminal attached to the thinner inner section of the second metal block, and a third terminal attached to the thinner inner section of the third metal block.

According to an embodiment of a method of manufacturing a semiconductor die package, the method comprises: placing a first metal block and a second metal block on a support substrate at a distance from one another, the first and second metal blocks each having a thicker outer section and a thinner inner section protruding from the thicker outer section toward the other metal block; attaching a first terminal of a semiconductor die to the thinner inner section of the first metal block and a second terminal of the semiconductor die to the thinner inner section of the second metal block; and attaching a terminal of the semiconductor die facing away from the support substrate to a thinner inner section of a third metal block placed on the semiconductor die, the third metal block further having a first thicker outer section at a first end of the thinner inner section and a second thicker outer section at a second end of the thinner inner section opposing the first end.

According to another embodiment of a method of manufacturing a semiconductor die package, the method comprises: providing a first enclosure section including a first metal block embedded in a first electrically insulating substrate, the first metal block having a thinner inner section, a first thicker outer section at a first end of the thinner inner section and a second thicker outer section at a second end of the thinner inner section opposing the first end; providing a second enclosure section including second and third metal blocks embedded in a second electrically insulating substrate at a distance from one another, the second and third metal blocks each having a thicker outer section and a thinner inner section protruding inward from the thicker outer section; attaching a first terminal of a semiconductor die to the thinner inner section of the second metal block and a second terminal of the semiconductor die to the thinner inner section of the third metal block; and attaching the thinner inner section of the first metal block to the terminal of the semiconductor die facing away from the second and third metal blocks to form an enclosure from the first and second enclosure sections in which the semiconductor die is disposed.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes

FIG. 3 illustrates an embodiment of a semiconductor assembly including the molded semiconductor die package of FIG. 2 attached to a circuit board in a horizontal mounting position.

FIG. 4 illustrates another embodiment of a semiconductor assembly including the molded semiconductor die package of FIG. 2 attached to a circuit board in a horizontal mounting position.

FIG. 5, which includes

FIG. 10, which includes FIGS. 10A through 10E, illustrates an embodiment of a method of manufacturing a molded semiconductor die package with multiple mounting configurations.

FIG. 11, which includes

FIG. 13, which includes

FIG. 14, which includes

FIG. 16, which includes

FIG. 17, which includes FIGS. 17A through 17C, illustrates an embodiment of a method of manufacturing a non-molded semiconductor die package with multiple mounting configurations.

FIG. 18, which includes FIGS. 18A and 18B, illustrates a perspective view of an embodiment of a dual-chip semiconductor die package with multiple mounting configurations before and after molding.

FIG. 19, which includes FIGS. 19A and 19B, illustrates a perspective view of another embodiment of a dual-chip semiconductor die package with multiple mounting configurations before and after molding.

FIG. 20, which includes FIGS. 20A and 20B, illustrates a perspective view of an embodiment of a half-bridge semiconductor die package with multiple mounting configurations before and after molding.

FIG. 21, which includes FIGS. 21A and 21B, illustrates a perspective view of another embodiment of a half-bridge semiconductor die package with multiple mounting configurations before and after molding.

DETAILED DESCRIPTION

The embodiments described herein provide molded and non-molded semiconductor die packages with multiple mounting configurations which can be used in different types of applications. This way, the same semiconductor die package can be used in different applications without requiring a package redesign or different type of package. The semiconductor die packages include metal blocks which have thinner inner sections for attaching to the terminals of one or more semiconductor dies, and thicker outer sections which form the terminals of the package. As such, internal electrical connections such as wire bonds, ribbons, clips, etc. can be dispensed with and the electrical connections to the semiconductor die(s) included in the package are facilitated exclusively by the metal blocks which also form the terminals of the package.

Figures 1A, 1B:
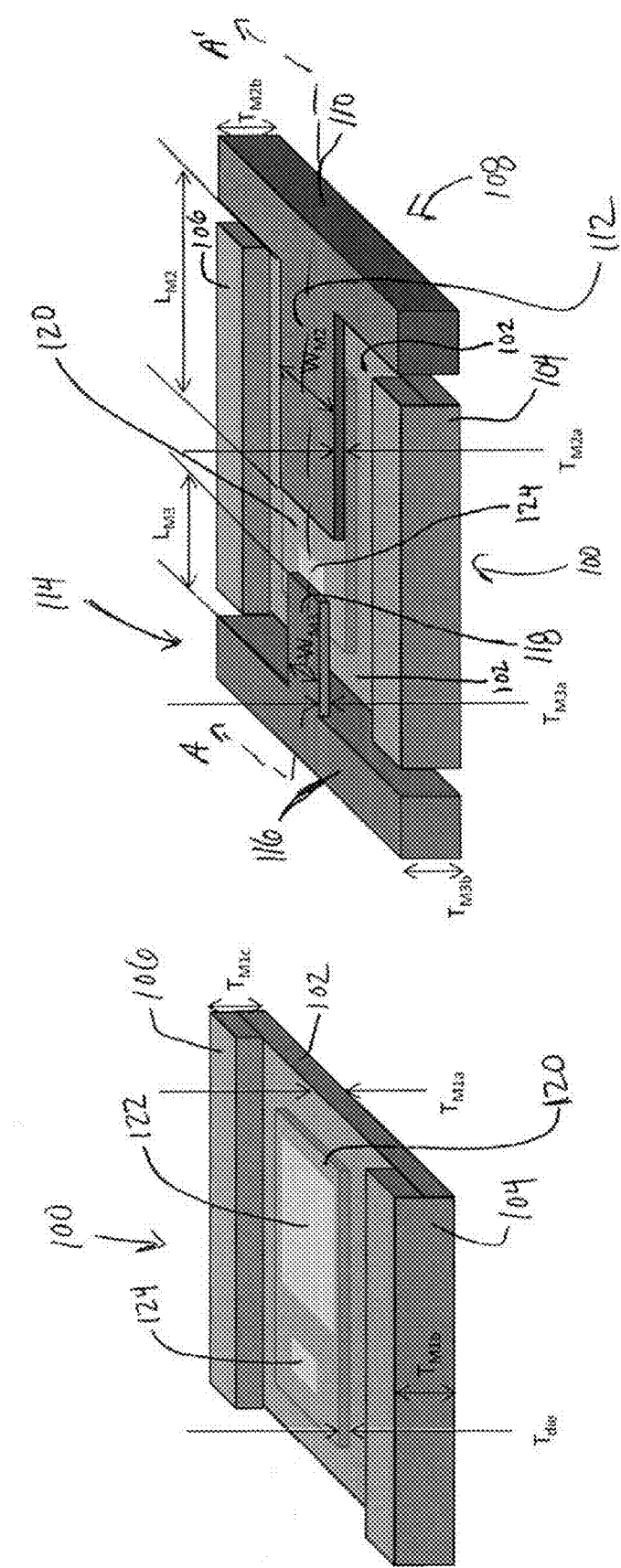
FIGS. 1A through 1O, illustrates different views of an embodiment of a semiconductor die package with multiple mounting configurations during different stages of an assembly process.
Figure 1C:
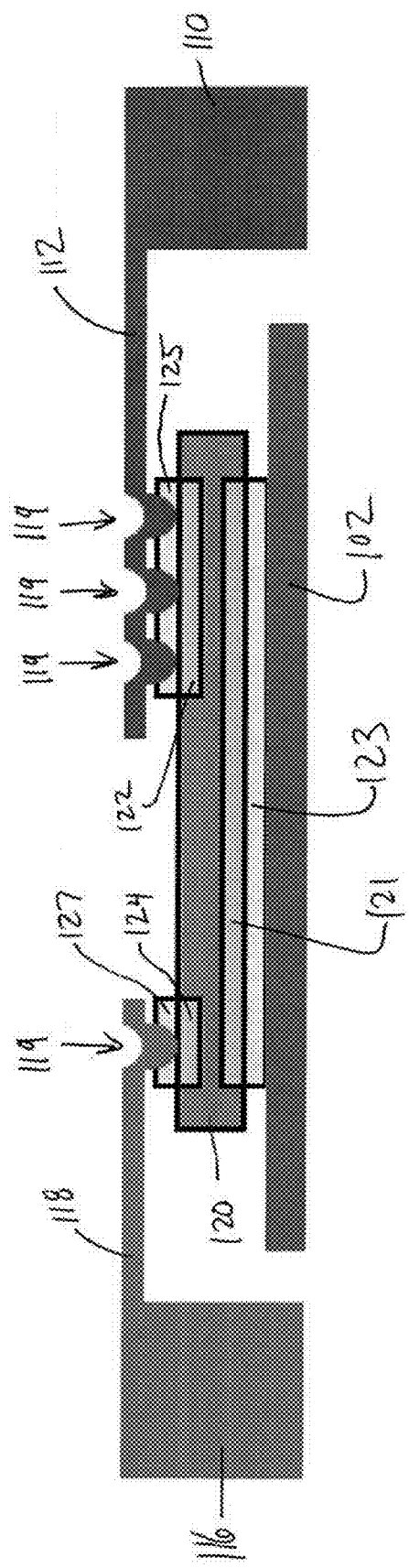
FIG. 1, which includes

FIG. 1, which includes FIGS. 1A through 1C, illustrates a perspective view of an embodiment of a semiconductor die package with multiple mounting configurations. FIG. 1A shows the bottom part of the package during the package assembly process, and FIG. 1B shows the package later in the assembly process. The semiconductor die package includes a first metal block 100 having a thinner ($T_{M1a}$) inner section 102, a first thicker ($T_{M1b}$) outer section 104 at a first end of the thinner inner section 102 and a second thicker ($T_{M1c}$) outer section 106 at the opposing end of the thinner inner section 102. The semiconductor die package further includes a second metal block 108 insulated from the first metal block 100 and having a thicker ($T_{M2b}$) outer section 110 and a thinner ($T_{M2a}$) inner section 112 protruding inward (i.e. directed or moving toward the inside or interior of the package) from the thicker outer section 110, and a third metal block 114 insulated from the first and second metal blocks 100, 108 and having a thicker ($T_{M3b}$) outer section 116 and a thinner ($T_{M3a}$) inner section 118 protruding inward from the thicker outer section 116.

One or more of the metal blocks 100, 108, 114 can each have one or more dimples 119 to provide better contact to the die pads and facilitate a more coplanar placement as illustrated in FIG. 10 which is a cross-sectional view of the package taken along the line labelled A-A' in FIG. 1B. The metal blocks 100, 108, 114 can comprise copper, which may include pure copper that may contain trace impurities or copper alloys. Examples of metal block materials include copper, copper-aluminum, copper alloyed with nickel, iron, zinc, silicon, and others such as C19400, C70250, C19210. In some embodiments, the metal blocks 100, 108, 114 can comprise a plurality of layers of different materials, for example, an outer high conductivity layer comprising relatively pure copper while comprising an inner layer of alloyed copper or other materials designed to provide mechanical stability. In other embodiment, the metal blocks 100, 108, 114 are of a single, continuous construction.

One or more semiconductor dies 120 are included in the semiconductor die package. In FIG. 1, a semiconductor die 120 has a first terminal 121 attached to the thinner inner section 102 of the first metal block 100 by a die attach material 123, a second terminal 122 attached to the thinner inner section 112 of the second metal block 108 by a die attach material 125, and a third terminal 124 attached to the thinner inner section 118 of the third metal block 114 by a die attach material 127. The die attach material 123, 125, 127 can be solder, glue, a pre-plated surface or any other standard material or interface for joining or attaching a terminal of a semiconductor die to a metal block. The first die terminal is disposed at the backside of the die 120 according to this embodiment and therefore is out of view in FIG. 1, and the second and third die terminals 122, 124 are disposed at the front side of the die 120. In a purely illustrative example, the terminal at the backside of the die 120 can be a drain terminal of a vertical transistor and the terminals 122, 124 at the front side of the die 120 can be source and gate terminals, respectively. Other die terminal configurations can be accommodated, depending on the type of die(s) included in the package.

Internal electrical connections such as wire bonds, ribbons, clips, etc. are not used for connecting to the terminals 122, 124 of the semiconductor die 120. Instead electrical connections to the die 120 are facilitated exclusively by the metal blocks 100, 108, 114, the thicker sections 104, 106, 110, 116 of which form terminals of the package. The terminals 122, 124 of the semiconductor die 120 can be attached to the respective thinner inner sections 102, 112, 118 of the metal blocks 100, 108, 114 using any standard die attach process such as soldering, advanced diffusion soldering, gluing, plating, etc.

The thinner inner section 112 of the second metal block 108 can be disposed in a different plane than the thinner inner section 102 of the first metal block 100, and the thinner inner section 118 of the third metal block 114 can be coplanar with the thinner section 112 of the second metal block 108 as shown in FIG. 1. According to this embodiment, the thinner inner section 112 of the second metal block 108 protrudes toward the third metal block 114 and the thinner inner section 118 of the third metal block 114 protrudes toward the second metal block 108. The thinner inner section 112 of the second metal block 108 can be wider ($W_{M2}$) and longer ($L_{M2}$) than the thinner inner section 118 of the third metal block 114 i.e. $W_{M2}>W_{M3}$ and $L_{M2}>L_{M3}$ in FIG. 1B. The differences in width and length are a function of the die terminal alignments e.g. gate and source pad alignments, respectively, to maximize product performance. Also according to this embodiment, the semiconductor die 120 is interposed between the thinner inner section 102 of the first metal block 100 and the thinner inner sections 112, 118 of the second and third metal blocks 108, 114. The thicker outer sections 104, 106, 110, 116 of the metal blocks 100, 108, 114 can each be thicker than the semiconductor die i.e. $T_{M1b}>T_{die}$, $T_{M2b}>T_{die}$ and $T_{M3b}>T_{die}$ in FIGS. 1A and 1B where $T_{die}$ indicates the thickness of the die 120.

Figures 2A, 2B:
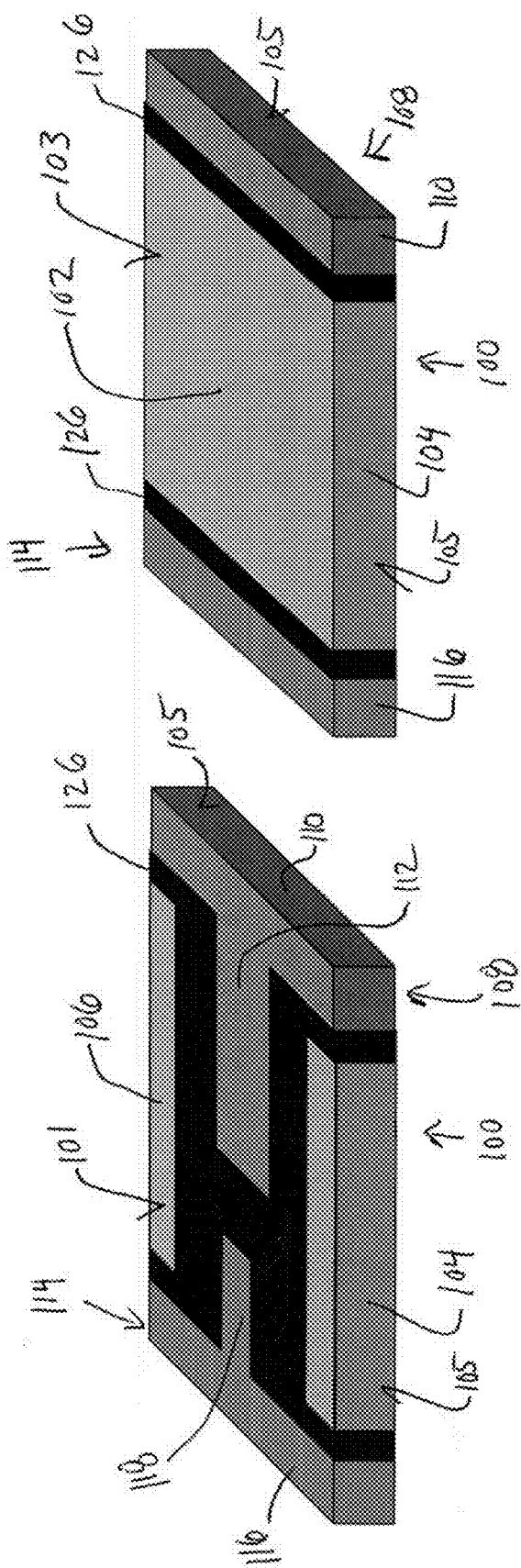
FIGS. 2A and 2B, illustrates respective top and bottom perspective views of the semiconductor die package of FIG. 1 after molding.

FIG. 2, which includes FIGS. 2A and 2B, illustrates a perspective view of the semiconductor die package after molding. FIG. 2A shows the top side of the molded package, and FIG. 2B shows the bottom side of the molded package. The metal blocks 100, 108, 114 are insulated from one another by molding compound 126 according to this embodiment. The thinner inner section 102 and thicker outer sections 104, 106 of the first metal block 100 are at least partly uncovered by the molding compound 126 according to this embodiment. The thinner inner section 112, 118 and thicker outer section 110, 116 of the second and third metal blocks 108, 114 are also at least partly uncovered by the molding compound 126 according to this embodiment.

The terminals of the package formed by the metal blocks 100, 108, 114 can be contacted in the same plane regardless of whether the package is placed in a horizontal mounting position or a vertical mounting position. In the horizontal mounting position, the top or bottom main surface 101, 103 of the package faces a mounting substrate such as a circuit board like a PCB (printed circuit board). For example, the main heat dissipation (top or bottom) surface 101/103 of the package can face the mounting substrate which can include a heat slug for dissipating heat from the package. Alternatively, the main heat dissipation (top or bottom) surface 101/103 of the package can face way from the mounting substrate in which case a heat sink can be attached to the main heat dissipation surface 101/103 of the package. In the vertical mounting position, an edge 105 of the package faces the mounting substrate.

FIG. 3 illustrates an embodiment of a semiconductor assembly including the semiconductor die package attached to a circuit board 130 in the horizontal mounting position with the bottom main surface 103 of the package facing the circuit board 130. The terminals of the package are attached to corresponding electrical conductors (out of view) of the circuit board using any standard die attach material 132 such as solder, glue, pre-plated surface, etc. For example, the circuit board 130 can be a PCB and the terminals of the package are attached to corresponding conductive traces (out of view) of the PCB. In each case, the thicker outer sections 104, 106, 110, 116 of the metal blocks 100, 108, 114 form the terminals of the package and are contacted in the same plane by the circuit board 130 along one main surface 103 of the package in the horizontal mounting position according to this embodiment.

FIG. 4 illustrates another embodiment of a semiconductor assembly including the semiconductor die package attached to a circuit board 130 in the horizontal mounting position with the bottom main surface 103 of the package facing the circuit board 130. The embodiment shown in FIG. 4 is similar to the embodiment shown in FIG. 3, however, the die attach material 132 extends partly onto the sidewalls 134 of the thicker outer sections 104, 106, 110, 116 of the metal blocks 100, 108, 114 i.e. the terminals of the package to provide additional solder joint coverage.

Figure 5B:
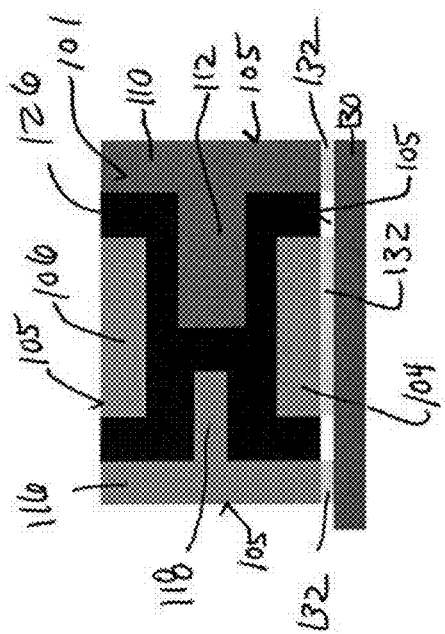
FIGS. 5A and 5B, illustrates respective front and back perspective views of an embodiment of a semiconductor assembly including the molded semiconductor die package of FIG. 2 attached to a circuit board in a vertical mounting position.
Figure 5A:
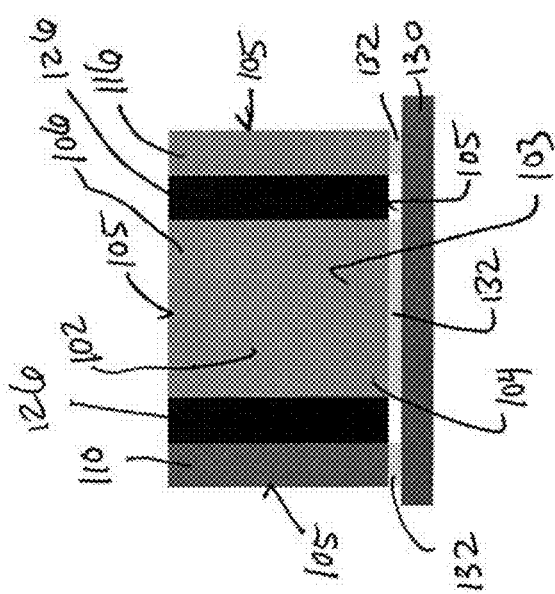

FIG. 5, which includes FIGS. 5A and 5B, illustrates an embodiment of a semiconductor assembly including the semiconductor die package attached to a circuit board 130 such as a PCB in the vertical mounting position with one edge 105 of the package facing the circuit board 130. FIG. 5A shows the semiconductor assembly in a direction facing the bottom main surface 103 of the package, and FIG. 5B shows the semiconductor assembly in a direction facing the top main surface 101 of the package. The terminals of the package are attached to corresponding electrical conductors (out of view) of the circuit board 130 using any standard die attach material 132 such as solder, glue, pre-plated surface, etc. The terminals of the package formed by the thicker outer sections 104, 106, 110, 116 of the metal blocks 100, 108, 114 are contacted in the same plane by the circuit board 130 along one edge 105 of the package in the vertical mounting position according to this embodiment.

Figure 6:
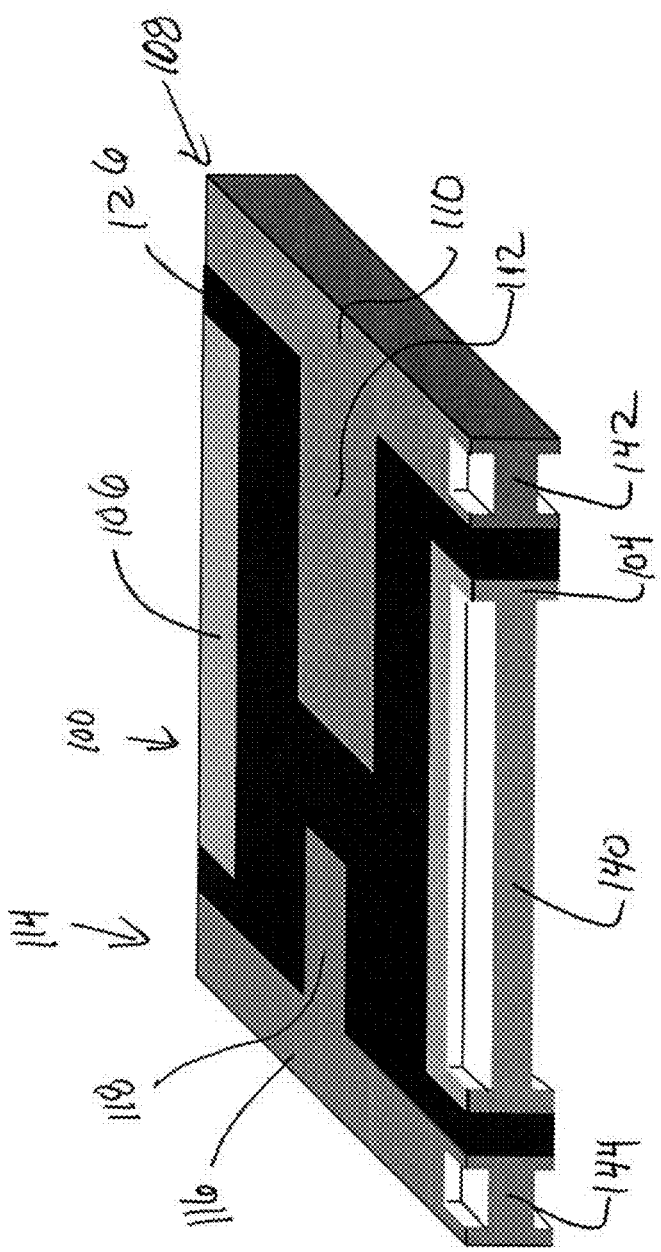
FIG. 6 illustrates a perspective view of another embodiment of a molded semiconductor die package with multiple mounting configurations.

FIG. 6 illustrates an embodiment of the semiconductor die package where the thicker outer section 110 of the second metal block 108, the thicker outer section 116 of the third metal block 114 and one of the thicker outer sections 104 of the first metal block 100 are each narrowed (i.e. less wide) at the same end. This narrowing results in each metal block 100, 108, 114 having a tab or insert 140, 142, 144 for use in mounting the package to a substrate such as a circuit board in the vertical mounting position via a locking feature.

Figure 7:
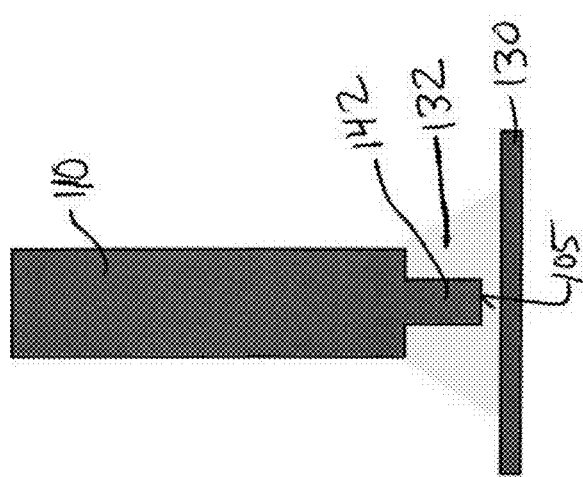
FIG. 7 illustrates an embodiment of a semiconductor assembly including the molded semiconductor die package of FIG. 6 attached to a circuit board in a vertical mounting position.

FIG. 7 illustrates an embodiment of a semiconductor assembly that includes the semiconductor die package with the tabs/insert locking features 140, 142, 144 mounted to a circuit board 130 in the vertical mounting position. According to this embodiment, solder 132 attaches each tab/insert 140, 142, 144 to a corresponding electrical conductor (out of view) of the circuit board 130 to form an electrical connection between the package and the board 130.

Figure 8:
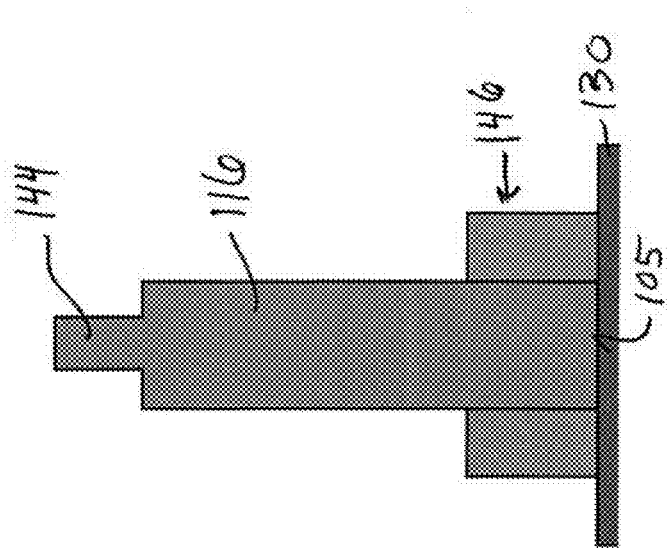
FIG. 8 illustrates another embodiment of a semiconductor assembly including the molded semiconductor die package of FIG. 6 attached to a circuit board in a vertical mounting position.

FIG. 8 illustrates another embodiment of a semiconductor assembly that includes the semiconductor die package with the tabs/inserts 140, 142, 144 mounted to a circuit board 130 in the vertical mounting position. The embodiment shown in FIG. 8 is similar to the embodiment shown in FIG. 7, however, the edge 105 of the package with the tabs/inserts 140, 142, 144 faces away from the circuit board 130 in the vertical mounting position. According to this embodiment, the end of the metal blocks 100, 108, 114 without the tabs/inserts 140, 142, 144 in inserted into a plug-in socket 146 disposed on the circuit board 130 to form an electrical connection between the package and the board 130 due to identical sides or edges which allow for device vertical placement flexibility.

Figure 9:
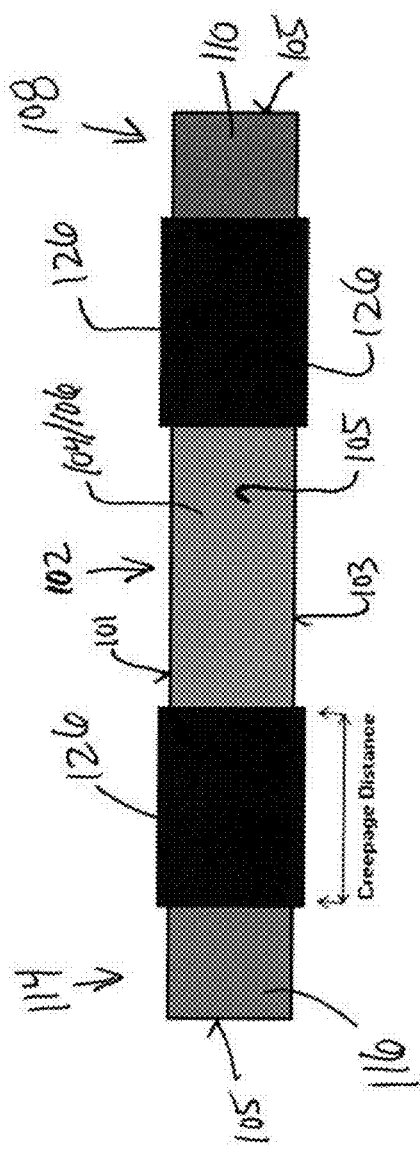
FIG. 9 illustrates a perspective view of an embodiment of a molded semiconductor die package with multiple mounting configurations and enhanced creepage properties.

FIG. 9 illustrates yet another embodiment of the semiconductor die package where the creepage distance is increased between the first metal block 100 and the second and third metal blocks 108, 114. Creepage refers to the leakage path along the surface of an electrically insulating material interposed between two conductors. The creepage distance can be increased by lengthening the leakage path. In FIG. 9, the creepage distance is increased between the first metal block 100 and the second and third metal blocks 108, 114 by forming the molding compound 126 so that the molding compound 126 protrudes outward from a first (e.g. top) main surface 101/103 of the package further than the first, second and third metal blocks 100, 108, 114. The creepage distance similarly can be increased along the opposite/second (e.g. bottom) main surface 103/101 of the package by forming the molding compound 126 so that the molding compound protrudes outward from the second main surface 103/101 of the package further than the first, second and third metal blocks 100, 108, 114. With the added creepage, part of the metal blocks 100, 108, 114 can be raised due to the additional mould height and have a step down at the periphery of the metal blocks 100, 108, 114 to facilitate connection to a board. Alternatively or in addition, the board pads can be raised where needed or the board has a drainage/step down to account for the mould protrusions.

FIG. 10, which includes FIGS. 10A through 10E, illustrates an embodiment of a method of manufacturing the semiconductor die package. In FIG. 10A, the second and third metal blocks 108, 114 are placed on a temporary support substrate 150 at a distance (d) from one another. The second and third metal blocks 108, 114 each have a thicker outer section 110, 116 and a thinner inner section 112, 118 protruding from the corresponding thicker outer section 110, 116 toward the other metal block as previously described herein. In FIG. 10B, a die attach material 160 e.g. such as glue or solder is applied to the thinner inner sections 112, 118 of the second and third metal blocks 108, 114. In FIG. 10C, a first terminal (out of view) of a semiconductor die 120 is attached to the thinner inner section 112 of the second metal block 108 and a second terminal (out of view) of the semiconductor die 120 is attached to the thinner inner section 118 of the third metal block 114 by the die attach material 160. In FIG. 10D, a die attach material 162 e.g. such as glue or solder is applied to a terminal (out of view) of the semiconductor die 120 which faces away from the support substrate 150. In FIG. 10E, the terminal of the semiconductor die 120 facing away from the support substrate 150 is attached to the thinner inner section 102 (out of view) of the first metal block 100 placed on the semiconductor die 120 by the die attach material 162. The first metal block 100 also has thicker outer sections 104, 106 at opposing ends of the thinner inner section 102 as previously described herein.

Figure 11B:
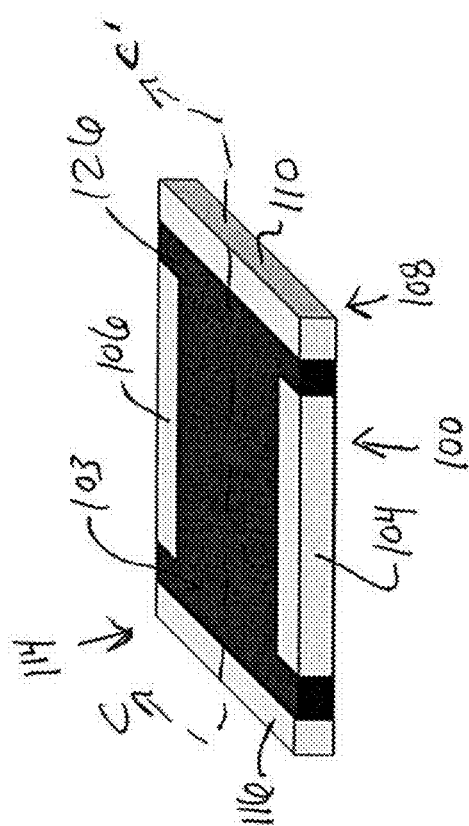
FIGS. 11A through 11D, illustrates different views of an embodiment of a molded semiconductor die package with multiple mounting configurations.
Figure 11A:
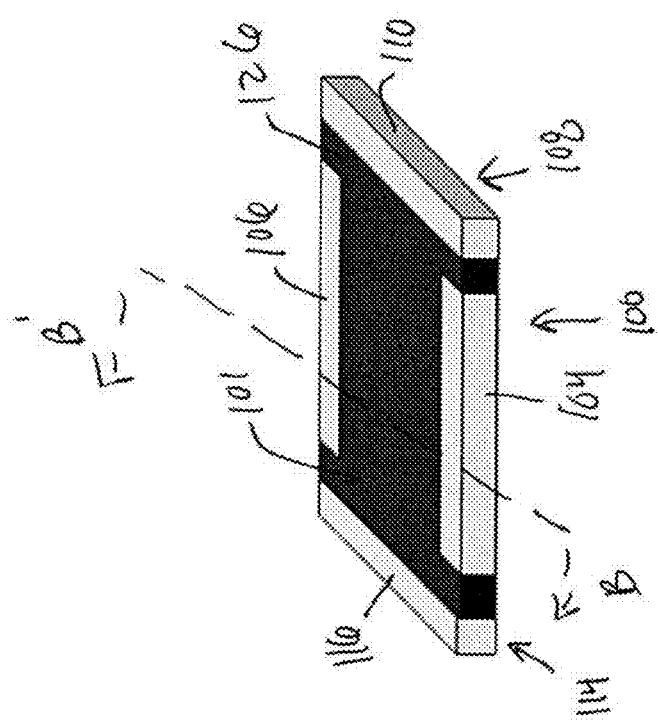
Figure 11C:
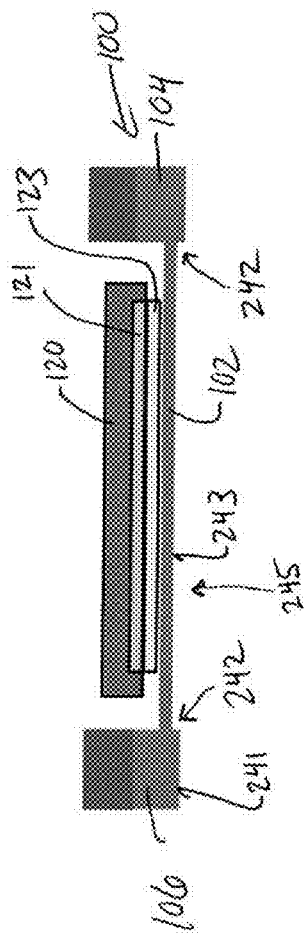
Figure 11D:
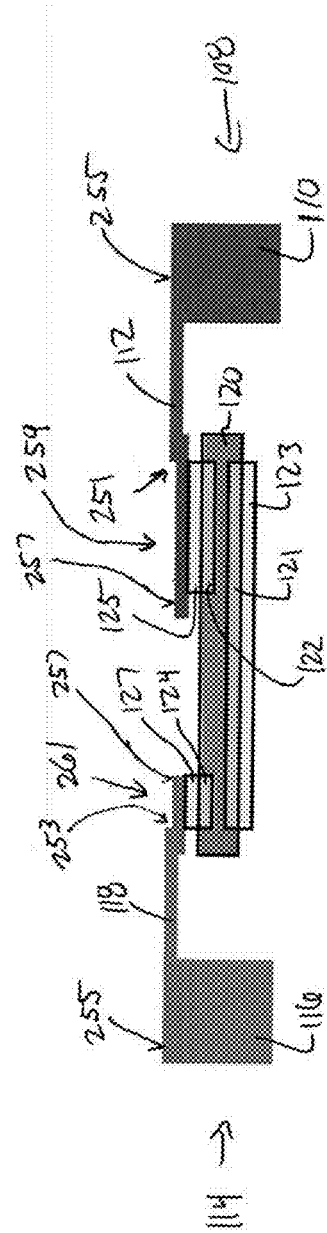

FIG. 11, which includes FIGS. 11A through 11D, illustrates still another embodiment of the semiconductor die package. FIG. 11A shows the top surface 101 of the package after molding, and FIG. 11B shows the bottom surface 103 of the package. The metal blocks 100, 108, 114 are insulated from one another by the molding compound 126. According to this embodiment, the thinner inner sections 102, 112, 118 of the metal blocks 100, 108, 114 are covered by the molding compound 126 so that only the thicker outer sections 104, 106, 110, 116 of the metal blocks 100, 108, 114 remain at least partly uncovered by the molding compound 126. FIG. 110 illustrates a cross-sectional view of the package taken along the line labelled B-B' in FIG. 11A before molding, and shows a step 242 between the bottom surface 241 of the thicker outer sections 104, 106 of the first metal block 100 and the bottom surface 243 of the thinner inner section 102 of the first metal block 100. The molding compound 126 fills the resulting step/recess region 245 at the bottom of the package and covers the thinner inner section 102 of the first metal block 100 in the step/recess region 245. FIG. 11D illustrates a cross-sectional view of the package taken along the line labelled C-C' in FIG. 11B before molding, and shows a step 251, 253 between the top surface 255 of the thicker outer sections 110, 116 of the second and third metal blocks 108, 114 and the top surface 257 of the corresponding thinner inner section 112, 118 of the second and third metal blocks 108, 114. The molding compound 126 fills the resulting step/recess regions 259, 261 at the top of the package and covers the thinner inner sections 112, 118 of the second and third metal blocks 108, 114 in the step/recess regions 259, 261.

Figure 12:
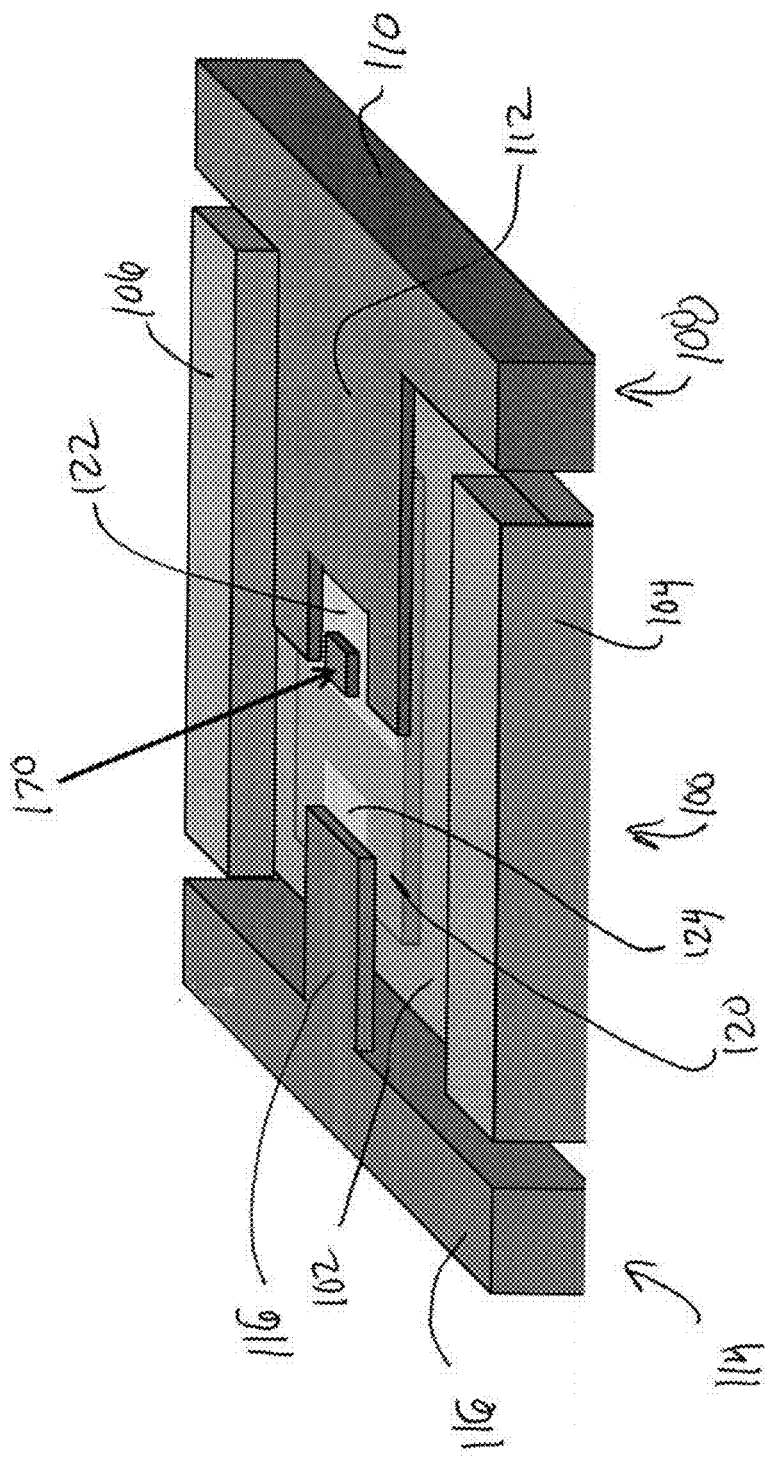
FIG. 12 illustrates a perspective view of yet another embodiment of a semiconductor die package with multiple mounting configurations prior to molding.

FIG. 12 illustrates another embodiment of the semiconductor die package prior to molding. According to this embodiment, the further includes a fourth metal block 170 attached to one of the terminals 122 of the die 120 and which forms an additional terminal of the package. For example in the case of a transistor die 120, the fourth metal block 170 can be attached to the source terminal 122 of the die 120 to provide the package with a source sense terminal. The source sense terminal may be too small and difficult for inspection. In this case, a sidewall solder inspection process can be used.

Figure 13B:
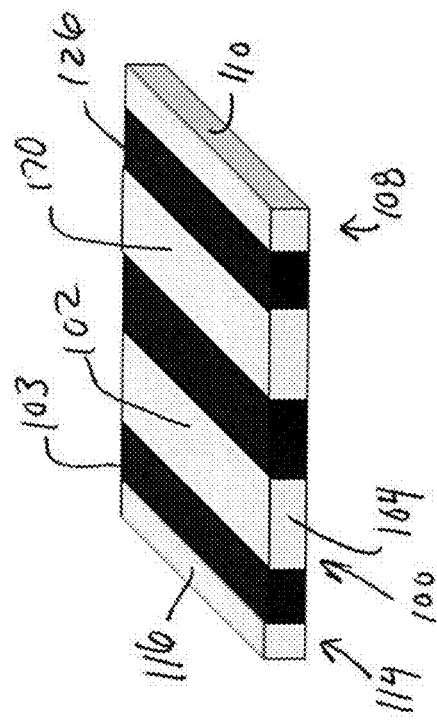
FIGS. 13A and 13B, illustrates respective top and bottom perspective views of still another embodiment of a molded semiconductor die package with multiple mounting configurations.
Figure 13A:
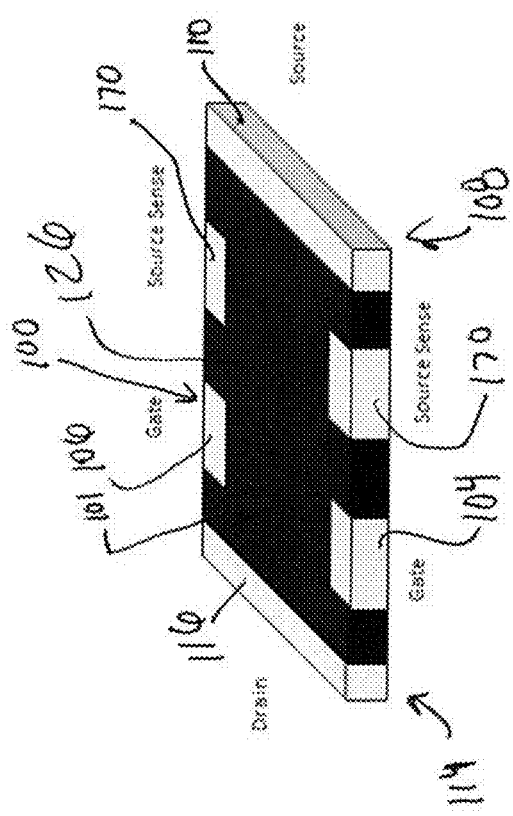

FIG. 13, which includes FIGS. 13A and 13B, illustrates another embodiment of the semiconductor die package with four terminals. FIG. 13A shows the top surface 101 of the package after molding, and FIG. 13B shows the bottom surface 103 of the package. According to this embodiment, second and third metal blocks 108, 114 are provided for the source and drain terminals of the transistor die 120, respectively. The first metal block 100 is provided for the gate terminal of the transistor die 120. The fourth metal block 170 is provided for the source sense terminal of the transistor die 120. Other terminal configurations can be realized by providing correspondingly shaped metal blocks.

Figure 14A:
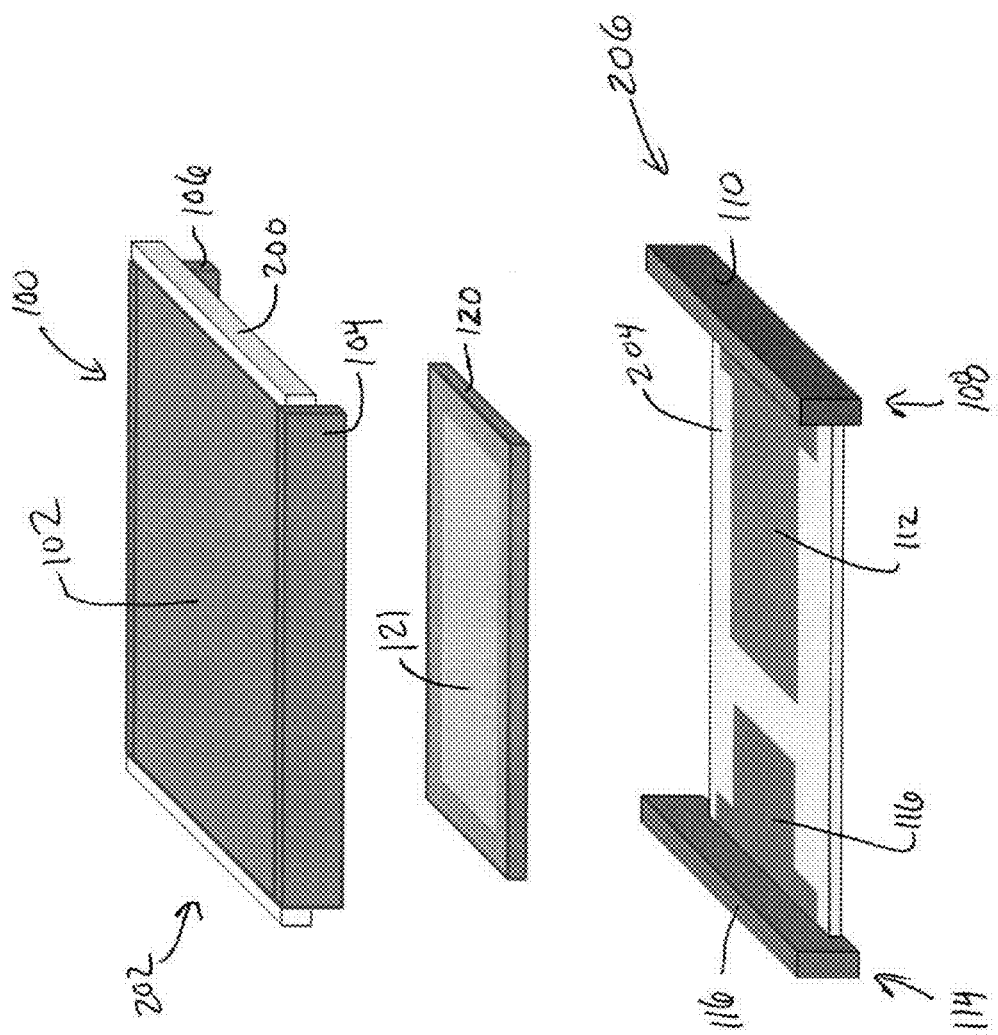
FIGS. 14A through 14C, illustrates different views of an embodiment of a non-molded semiconductor die package with multiple mounting configurations.
Figure 14B:
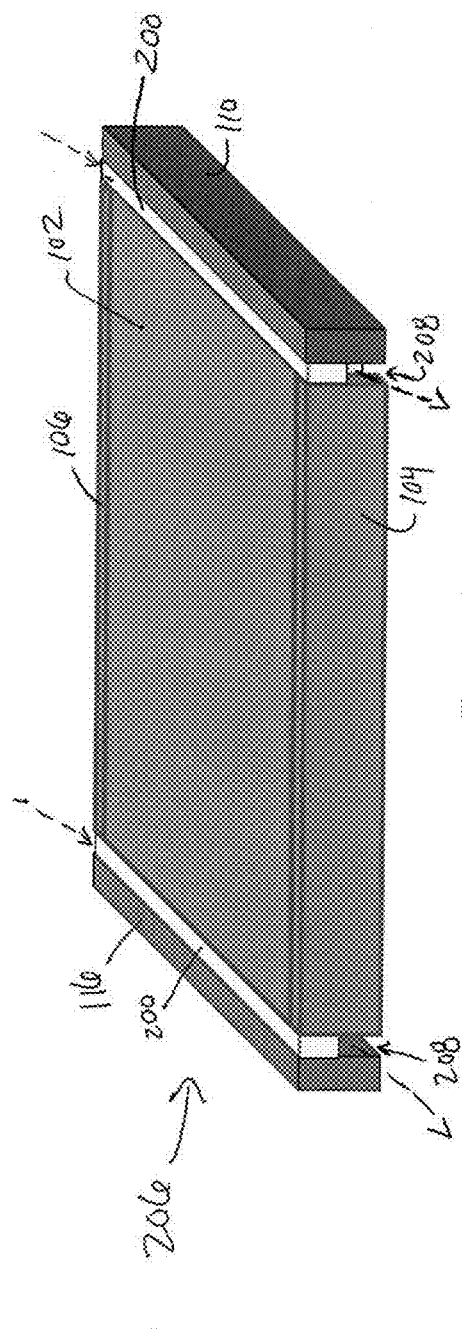
Figure 14C:
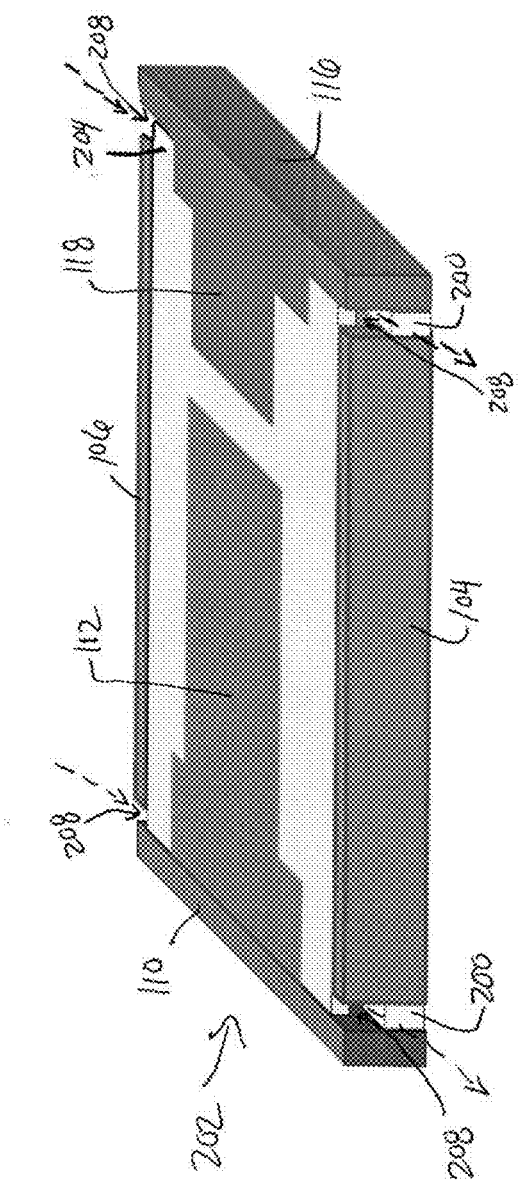

FIG. 14, which includes FIGS. 14A through 14C, illustrates a perspective view of an embodiment of a non-molded semiconductor die package with multiple mounting configurations. FIG. 14A shows an exploded view of the package, FIG. 14B shows the bottom part of the package and FIG. 14C shows the top part of the package. According to this embodiment, the first metal block 100 is embedded in a first electrically insulating substrate 200 such as a laminate, ceramic substrate, etc. to form a first enclosure section 202. The second and third metal blocks 108, 114 are embedded in a second electrically insulating substrate 204 such as a laminate, ceramic substrate, etc. to form a second enclosure section 206. The first and second enclosure sections 202, 206 are attached to one another e.g. by an adhesive such as glue or other suitable means to form an enclosure in which the semiconductor die(s) 120 is disposed.

A gap can be present between the first and second enclosure sections 202, 206 in at least two corner regions of the enclosure as shown in FIGS. 14A and 14B, so that the package has an opening 208 in at least two of the corner regions. In one case, the package has an opening 208 in the corner regions at one end of the enclosure. In another case, the package has an opening 208 in the corner regions at opposing ends of the enclosure as shown in FIGS. 14B and 14C. In each case, the openings 208 can be realized by designing the electrically insulating substrates 200, 204 such that a gap is present between the first and second enclosure sections 202, 206 in at least two corner regions of the enclosure after the first and second enclosure sections 202, 206 are assembled into the package. The openings 208 in one or both ends of the enclosure allow for a fluid (liquid or gas) to enter and exit the enclosure as indicated by the dashed lines in FIGS. 14B and 14C, increasing the heat dissipation capacity of the package.

In one embodiment, the width of the thinner inner section of the second and/or third metal blocks 108, 114 narrows at least once in a direction toward the center of the package. For example, the thicker outer section 110 of the second metal block 108 can be wider than the widest part of the thinner inner section 112 of the second metal block 108 and the thinner inner section 112 of the second metal block 108 can become more narrow further from the thicker outer section 110 of the second metal block 108. For example, the thinner inner section 112 of the second metal block 108 can have one or more step-wise changes in its width as shown in FIG. 14C. The third metal block 114 can have the same or similar configuration.

The interior of the enclosure including the semiconductor die(s) 120 can be coated with nanoparticles which are impervious to at least one of water and moisture. The nanoparticles can be injected into one or more of the openings 208 in the corner regions of the enclosure formed by the joining the first and second enclosure sections 202, 206. Alternatively, the interior surfaces of the package components can be pre-coated with the nanoparticles prior to assembly of the package. In either case, the nanoparticles protect interior components of the package which are sensitive to corrosion, etc. such as the interior surfaces of the metal blocks 100, 108, 114 and the semiconductor die(s) 120.

Figure 15:
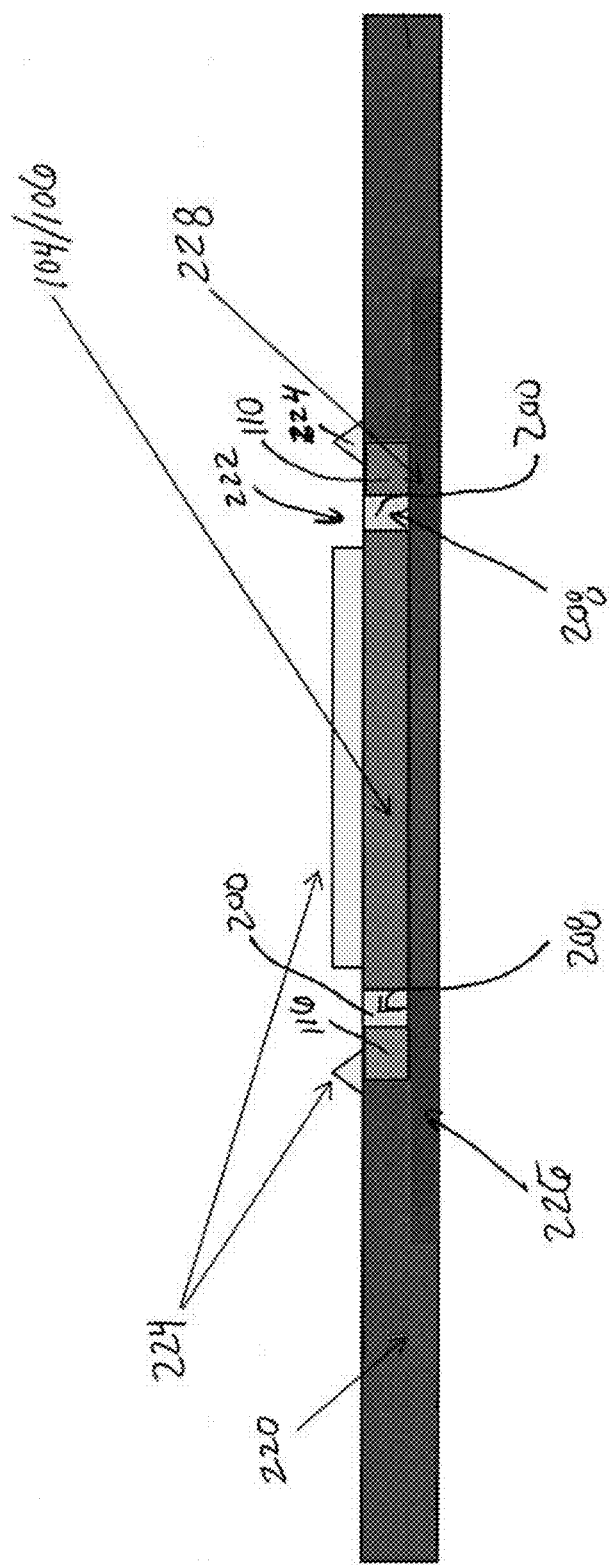
FIG. 15 illustrates an embodiment of a semiconductor assembly including the non-molded semiconductor die package of FIG. 14 attached to a circuit board in a horizontal mounting position.

FIG. 15 illustrates an embodiment of a semiconductor assembly including the non-molded semiconductor die package of FIG. 14 attached to a circuit board 220. According to this embodiment, the semiconductor die package is seated in a recess 222 formed in the circuit board 220 and the terminals of the package are connected to different electrical conductors (out of view) of the circuit board 220 by solder 224. The terminals of the package are formed by the metal blocks 100, 108, 114.

The circuit board 220 can include a first passageway 226 connected to a first one of the openings 208 in the semiconductor die package for carrying a fluid (liquid or gas) entering the enclosure and a second passageway 228 connected to a second one of the openings 208 in the semiconductor die package for carrying a fluid exiting the enclosure. In the case of the interior of the enclosure being coated with nanoparticles which are impervious to water, the fluid can be a liquid such as water to further increase the heat dissipation capacity of the semiconductor assembly.

Figure 16A:
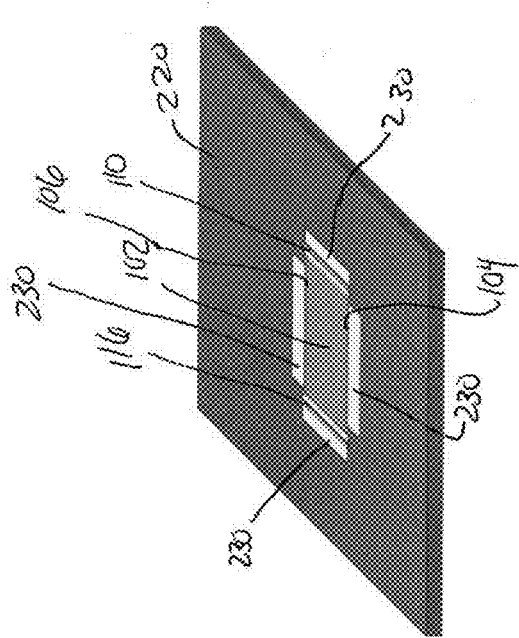
FIGS. 16A through 16C, illustrates the semiconductor assembly of FIG. 15 during different stages of assembly.
Figure 16B:
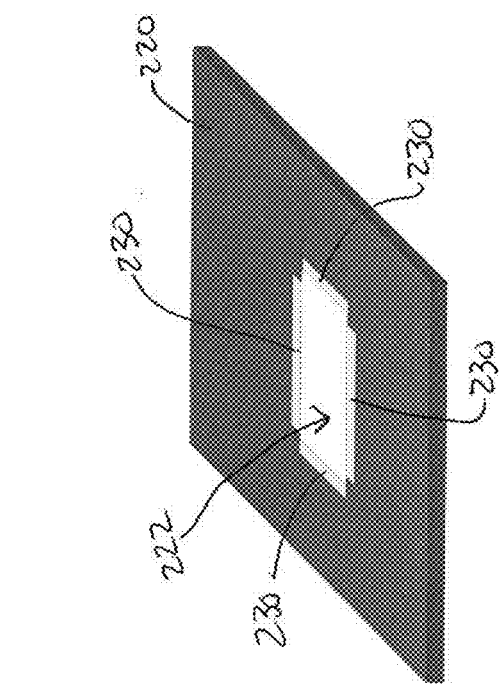
Figure 16C:
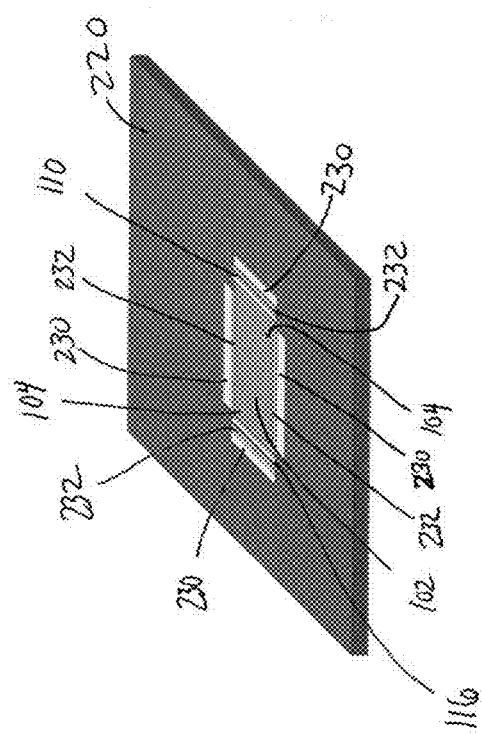

FIG. 16, which includes FIGS. 16A through 16C, illustrates an embodiment of a method of manufacturing the semiconductor assembly of FIG. 15. In FIG. 16A, the circuit board 220 is provided with a recess 222 for receiving the semiconductor die package. The circuit board 220 includes electrical conductors 230 such as metal traces adjacent the recess 222 in the board 220, for connecting to the terminals of the package. In FIG. 16B, the semiconductor die package is seated in the recess 222 of the circuit board 220. The first passageway 226 (out of view) in the circuit board 220 has an end connected to one opening 208 in the semiconductor die package and the second passageway 228 (out of view) has an end connected to another opening 208 in the semiconductor die package as shown in FIG. 15. In FIG. 16C, the terminals of the package are connected to different ones of the electrical conductors 230 of the circuit board 220 by solder 232.

FIG. 17, which includes FIGS. 17A through 17C, illustrates an embodiment of a method of manufacturing the non-molded semiconductor die package of FIG. 14. In FIG. 17A, the second enclosure section 206 is provided and which includes the second and third metal blocks 108, 114 embedded in the second electrically insulating substrate 204. In FIG. 17B, a first terminal (out of view) of the semiconductor die 120 is attached to the thinner inner section 112 of the second metal block 108 and a second terminal (out of view) of the semiconductor die 120 is attached to the thinner inner section 118 of the third metal block 114 as indicated by the downward arrow e.g. by a die attach material 240 such as solder, glue, pre-plated surface, etc. In FIG. 17C, the first enclosure section 202 is provided and which includes the first metal block 100 embedded in the first electrically insulating substrate 200. The thinner inner section 102 of the first metal block 100 is attached to a terminal 121 of the semiconductor die 120 facing away from the second enclosure section 206 as indicated by the downward arrow e.g. by a die attach material 244 such as solder, glue, pre-plated surface, etc. to form an enclosure from the first and second enclosure sections 202, 206 in which the semiconductor die 120 is disposed.

FIG. 18, which includes FIGS. 18A and 18B, illustrates a perspective view of an embodiment of a dual-chip semiconductor die package with multiple mounting configurations. FIG. 18A shows the package before molding and FIG. 18B shows the package after molding. Each die 120, 120' is attached at one side to a thinner inner section 102, 102' of a first metal block 100, 100' which also has a first thicker outer section 104, 104' at a first end of the thinner inner section 102, 102' and a second thicker outer section 106, 106' at the opposing end of the thinner inner section 102, 102'. Each die 120, 120' also has a terminal 112, 112' at the opposite side that is attached a thinner inner section 112, 112' of a second metal block 108, 108' insulated from the first metal block 100, 100' and which also has a thicker outer section 110, 110' from which the thinner inner section 112, 112' protrudes inward. A second terminal 124, 124' at this same side of each die 120, 120' is attached a thinner inner section 118, 118' of a third metal block 114, 114' insulated from the first and second metal blocks 100, 100', 108, 108' and which also has a thicker outer section 116, 116' from which the thinner inner section 118, 118' protrudes inward. According to this embodiment, the thicker outer section 110 of the second metal block 108 attached to the first die 120 faces the thicker outer section 116' of the third metal block 114' attached to the second die 120'.

FIG. 19, which includes FIGS. 19A and 19B, illustrates a perspective view of another embodiment of a dual-chip semiconductor die package with multiple mounting configurations. FIG. 19A shows the package before molding and FIG. 19B shows the package after molding. The embodiment shown in FIG. 19 is similar to the embodiment shown in FIG. 18, however, one thicker outer section 106 of the first metal block 100 attached to the first die 120 faces the other thicker outer section 104' of the first metal block 100' attached to the second die 120'.

FIG. 20, which includes FIGS. 20A and 20B, illustrates a perspective view of an embodiment of a half-bridge semiconductor die package with multiple mounting configurations. FIG. 20A shows the half-bridge package before molding and FIG. 20B shows the package after molding. The half-bridge package includes a first die 120 that forms the high-side switch of a half-bridge circuit and a second die 120 that forms the low-side switch of the half-bridge circuit. The drain terminal (D1) of the high-side transistor die 120 is attached to a thinner inner section 102 of a first metal block 100 which also has a first thicker outer section 104 at a first end of the thinner inner section 102 and a second thicker outer section 106 at the opposing end of the thinner inner section 102. The source terminal (S1) of the high-side transistor die 120 is attached to a thinner inner section 112 of a second metal block 108 insulated from the first metal block 100 and which also has a thicker outer section 110 from which the thinner inner section 112 protrudes inward. The gate terminal (G1) of the high-side transistor die 120 is attached to a thinner inner section 118 of a third metal block 114 insulated from the first and second metal blocks 100, 108 and which also has a thicker outer section 116 from which the thinner inner section 118 protrudes inward.

The source terminal (S2) of the low-side transistor die 120' is attached to a thinner inner section 102' of a first metal block 100' which also has a first thicker outer section 104' at a first end of the thinner inner section 102' and a second thicker outer section 106' at the opposing end of the thinner inner section 102'. The gate terminal (G2) of the low-side transistor die 120' is attached to a thinner inner section 118' of a third metal block 114' insulated from the first metal block 100' and which also has a thicker outer section 116' from which the thinner inner section 118' protrudes inward. The drain terminal (D2) of the low-side transistor die 120' is attached to a thinner inner section 112' of a second metal block 108' insulated from the first and third metal blocks 100', 114' and which also has a thicker outer section 110' in common with or shared by the other second block 110. According to this embodiment, the second metal blocks 108, 108' are common and the thicker outer section 110, 110' of the common second metal blocks 108, 108' forms a common connection between the source (S1) of the high-side transistor die 120 and the drain (D2) of the low-side transistor die 120' to form the output of the half-bridge circuit.

FIG. 21, which includes FIGS. 21A and 21B, illustrates a perspective view of another embodiment of a half-bridge semiconductor die package with multiple mounting configurations. FIG. 21A shows the half-bridge package before molding and FIG. 21B shows the package after molding. The embodiment shown in FIG. 21 is similar to the embodiment shown in FIG. 20, however, the first metal blocks 100, 100' have a common thicker outer section 104, 104' that connects the source (S1) of the high-side transistor die 120 and the drain (D2) of the low-side transistor die 120' to form the output of the half-bridge circuit.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor die package, comprising:
a first metal block having a thinner inner section, a first thicker outer section at a first end of the thinner inner section and a second thicker outer section at a second end of the thinner inner section opposing the first end;
a second metal block insulated from the first metal block and having a thicker outer section and a thinner inner section protruding inward from the thicker outer section;
a third metal block insulated from the first and second metal blocks and having a thicker outer section and a thinner inner section protruding inward from the thicker outer section; and
a semiconductor die having a first terminal attached to the thinner inner section of the first metal block, a second terminal attached to the thinner inner section of the second metal block, and a third terminal attached to the thinner inner section of the third metal block.

2. The semiconductor die package of claim 1, wherein the thinner inner section of the second metal block is disposed in a different plane than the thinner inner section of the first metal block; and wherein the thinner inner section of the third metal block is coplanar with the thinner section of the second metal block.

3. The semiconductor die package of claim 2, wherein the semiconductor die is interposed between the thinner inner section of the first metal block and the thinner inner sections of the second and third metal blocks.

4. The semiconductor die package of claim 2, wherein the thinner inner section of the second metal block is wider and longer than the thinner inner section of the third metal block.

5. The semiconductor die package of claim 2, wherein the width of at least one of the thinner inner section of the second metal block and the thinner inner section of the third metal block narrows at least once in a direction toward the semiconductor die.

6. The semiconductor die package of claim 1, wherein the first, second and third metal blocks form terminals of the package configured to be contacted in the same plane regardless of whether the package is placed in a horizontal mounting position or a vertical mounting position.

7. The semiconductor die package of claim 1, wherein the first, second and third metal blocks are insulated from one another by a molding compound.

8. The semiconductor die package of claim 7, wherein the molding compound protrudes outward from a first main surface of the package further than the first, second and third metal blocks.

9. The semiconductor die package of claim 8, wherein the molding compound protrudes outward from a second main surface of the package opposite the first main surface further than the first, second and third metal blocks.

10. The semiconductor die package of claim 7, wherein the thinner inner section and the first and second thicker outer sections of the first metal block are at least partly uncovered by the molding compound, wherein the thinner inner section and the thicker outer section of the second metal block are at least partly uncovered by the molding compound, and wherein the thinner inner section and the thicker outer section of the third metal block are at least partly uncovered by the molding compound.

11. The semiconductor die package of claim 1, wherein the thicker outer section of the second metal block, the thicker outer section of the third metal block and one of the thicker outer sections of the first metal block are each narrowed at the same end.

12. The semiconductor die package of claim 1, wherein the first metal block is embedded in a first electrically insulating substrate to form a first enclosure section, wherein the second and third metal blocks are embedded in a second electrically insulating substrate to form a second enclosure section, and wherein the first and second enclosure sections are attached to one another to form an enclosure in which the semiconductor die is disposed.

13. The semiconductor die package of claim 12, wherein a gap is present between the first and second enclosure sections in at least two corner regions of the enclosure so that the package has an opening in at least two of the corner regions.

14. The semiconductor die package of claim 13, wherein the package has an opening in the corner regions at a first end of the enclosure.

15. The semiconductor die package of claim 13, wherein the package has an opening in the corner regions at opposing ends of the enclosure.

16. The semiconductor die package of claim 13, wherein an interior of the enclosure including the semiconductor die is coated with nanoparticles which are impervious to at least one of water and moisture.

17. The semiconductor die package of claim 1, wherein the thicker outer section of the second metal block is wider than a thickest part of the thinner inner section of the second metal block, wherein the thinner inner section of the second metal block has a proximal end adjacent the thicker outer section of the second metal block and a distal end opposite the proximal end, and wherein the proximal end is wider than the distal end.

18. The semiconductor die package of claim 17, wherein the thicker outer section of the third metal block is wider than a thickest part of the thinner inner section of the third metal block, wherein the thinner inner section of the third metal block has a proximal end adjacent the thicker outer section of the third metal block and a distal end opposite the proximal end, and wherein the proximal end is wider than the distal end.

19. The semiconductor die package of claim 1, further comprising:
an additional first metal block having a thinner inner section, a first thicker outer section at a first end of the thinner inner section and a second thicker outer section at a second end of the thinner inner section opposing the first end;
an additional second metal block insulated from the additional first metal block and having a thicker outer section and a thinner inner section protruding inward from the thicker outer section;
an additional third metal block insulated from the additional first and second metal blocks and having a thicker outer section and a thinner inner section protruding inward from the thicker outer section; and
an additional semiconductor die having a first terminal attached to the thinner inner section of the additional first metal block, a second terminal attached to the thinner inner section of the additional second metal block, and a third terminal attached to the thinner inner section of the additional third metal block.

20. The semiconductor die package of claim 19, wherein one of the first, second and third metal blocks and one of the additional first, second and third metal blocks is a shared metal block that forms a common connection between one of the terminals of the semiconductor die and one of the terminals of the additional semiconductor die.

21. A semiconductor assembly, comprising:
a circuit board; and
a semiconductor die package attached to the circuit board, the semiconductor die package comprising:
a first metal block having a thinner inner section, a first thicker outer section at a first end of the thinner inner section and a second thicker outer section at a second end of the thinner inner section opposing the first end;
a second metal block insulated from the first metal block and having a thicker outer section and a thinner inner section protruding inward from the thicker outer section;
a third metal block insulated from the first and second metal blocks and having a thicker outer section and a thinner inner section protruding inward from the thicker outer section; and
a semiconductor die having a first terminal attached to the thinner inner section of the first metal block, a second terminal attached to the thinner inner section of the second metal block, and a third terminal attached to the thinner inner section of the third metal block.

22. The semiconductor assembly of claim 21, wherein the first, second and third metal blocks form terminals of the semiconductor die package contacted in the same plane by the circuit board regardless of whether the semiconductor die package is attached to the circuit board in a horizontal mounting position or a vertical mounting position.

23. The semiconductor assembly of claim 21, wherein the thicker outer section of the second metal block, the thicker outer section of the third metal block and one of the thicker outer sections of the first metal block are each narrowed at the same end, and wherein the semiconductor die package is attached to the circuit board in a vertical mounting position with solder contacting the narrowed end of the first, second and third metal blocks.

24. The semiconductor assembly of claim 21, wherein the first metal block is embedded in a first electrically insulating substrate to form a first enclosure section, wherein the second and third metal blocks are embedded in a second electrically insulating substrate to form a second enclosure section, and wherein the first and second enclosure sections are attached to one another to form an enclosure in which the semiconductor die is disposed.

25. The semiconductor assembly of claim 24, wherein a gap is present between the first and second enclosure sections in at least two corner regions of the enclosure on that the semiconductor die package has an opening in at least two of the corner regions, and wherein the circuit board includes a first passageway connected to a first one of the openings in the semiconductor die package for carrying a fluid entering the enclosure and a second passageway connected to a second one of the openings in the semiconductor die package for carrying a fluid exiting the enclosure.

26. The semiconductor assembly of claim 25, wherein the semiconductor die package is seated in a recess formed in the circuit board, wherein the first passageway has an end connected to the first one of the openings in the semiconductor die package, and wherein the second passageway has an end connected to the second one of the openings in the semiconductor die package.

27. The semiconductor assembly of claim 25, wherein an interior of the enclosure including the semiconductor die is coated with nanoparticles which are impervious to at least one of water and moisture.

28. The semiconductor assembly of claim 21, wherein the width of at least one of the thinner inner section of the second metal block and the thinner inner section of the third metal block narrows at least once in a direction toward the semiconductor die.

29. The semiconductor assembly of claim 21, wherein the thicker outer section of the second metal block is wider than a thickest part of the thinner inner section of the second metal block, wherein the thinner inner section of the second metal block has a proximal end adjacent the thicker outer section of the second metal block and a distal end opposite the proximal end, and wherein the proximal end is wider than the distal end.

30. A method of manufacturing a semiconductor die package, the method comprising:
    placing a first metal block and a second metal block on a support substrate at a distance from one another, the first and second metal blocks each having a thicker outer section and a thinner inner section protruding from the thicker outer section toward the other metal block;
    attaching a first terminal of a semiconductor die to the thinner inner section of the first metal block and a second terminal of the semiconductor die to the thinner inner section of the second metal block; and
    attaching a terminal of the semiconductor die facing away from the support substrate to a thinner inner section of a third metal block placed on the semiconductor die, the third metal block further having a first thicker outer section at a first end of the thinner inner section and a second thicker outer section at a second end of the thinner inner section opposing the first end.

31. A method of manufacturing a semiconductor die package, the method comprising:
    providing a first enclosure section including a first metal block embedded in a first electrically insulating substrate, the first metal block having a thinner inner section, a first thicker outer section at a first end of the thinner inner section and a second thicker outer section at a second end of the thinner inner section opposing the first end;
    providing a second enclosure section including second and third metal blocks embedded in a second electrically insulating substrate at a distance from one another, the second and third metal blocks each having a thicker outer section and a thinner inner section protruding inward from the thicker outer section;
    attaching a first terminal of a semiconductor die to the thinner inner section of the second metal block and a second terminal of the semiconductor die to the thinner inner section of the third metal block; and
    attaching the thinner inner section of the first metal block to a terminal of the semiconductor die facing away from the second and third metal blocks to form an enclosure from the first and second enclosure sections in which the semiconductor die is disposed.

32. The method of claim 31, wherein a gap is present between the first and second enclosure sections in at least two corner regions of the enclosure so that the semiconductor die package has an opening in at least two of the corner regions.

33. The method of claim 32, further comprising:
    coating an interior of the enclosure including the semiconductor die with nanoparticles which are impervious to at least one of water and moisture.

* * * * *